(12) United States Patent
Park et al.

(10) Patent No.: US 11,393,981 B2
(45) Date of Patent: Jul. 19, 2022

(54) METHOD OF MANUFACTURING A CELLULOSE NANOCRYSTAL SEMICONDUCTOR MATERIAL

(71) Applicant: ELECTRONICS AND TELECOMMUNICATIONS RESEARCH INSTITUTE, Daejeon (KR)

(72) Inventors: Nae-Man Park, Daejeon (KR); Sukyung Choi, Daejeon (KR); Jee Eun Oh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 17/064,892

(22) Filed: Oct. 7, 2020

(65) Prior Publication Data
US 2021/0202855 A1    Jul. 1, 2021

(30) Foreign Application Priority Data
Dec. 30, 2019   (KR) .................. 10-2019-0177569

(51) Int. Cl.
*H01L 51/00*   (2006.01)
*C08K 5/42*   (2006.01)
*C08B 1/00*   (2006.01)

(52) U.S. Cl.
CPC .......... *H01L 51/0035* (2013.01); *C08B 1/003* (2013.01); *C08K 5/42* (2013.01); *C08K 2201/001* (2013.01)

(58) Field of Classification Search
CPC .................................................. H01L 51/0035
See application file for complete search history.

(56) References Cited

U.S. PATENT DOCUMENTS

| | | | |
|---|---|---|---|
| 2009/0140239 A1 | 6/2009 | Lee et al. | |
| 2013/0237006 A1 | 9/2013 | Yun et al. | |
| 2013/0274384 A1* | 10/2013 | Dooley | C08K 9/04 524/35 |

FOREIGN PATENT DOCUMENTS

| | | |
|---|---|---|
| KR | 1020060032101 A | 4/2006 |
| KR | 1020140017787 A | 2/2014 |

OTHER PUBLICATIONS

Juntao Tang et al., "Funcationalization of cellulose nanocrystals for advanced applications", Journal of Colloid and Interface Science, May 15, 2017, pp. 397-409, vol. 494.
Sukyung Choi et al., "Chemical Doping of Cellulose Nanocrystal Symposium B: Carbon Nanostructures and Devices", Oct. 15, 2019, 236th Electrochemical Society Meeting.

* cited by examiner

*Primary Examiner* — William D Young
(74) *Attorney, Agent, or Firm* — Rabin & Berdo, P.C.

(57) ABSTRACT

The present disclosure relates to a method of manufacturing a semiconductor material including a cellulose nanocrystal. Particularly, according to the present disclosure, by attaching an electron withdrawing group to the surface of the cellulose nanocrystal, which is a nonconductor, holes are formed in the doped cellulose nanocrystal, and the cellulose nanocrystal may be used as a semiconductor material.

8 Claims, 3 Drawing Sheets

METHOD OF MANUFACTURING A CELLULOSE NANOCRYSTAL SEMICONDUCTOR MATERIAL

CROSS-REFERENCE TO RELATED APPLICATIONS

This U.S. non-provisional patent application claims priority under 35 U.S.C. § 119 of Korean Patent Application No. 10-2019-0177569, filed on Dec. 30, 2019, the entire contents of which are hereby incorporated by reference.

BACKGROUND

The present disclosure herein relates to a semiconductor material including a cellulose nanocrystal and a manufacturing method thereof.

Cellulose nanomaterials obtained from cellulose which is the most abundant polymer material in nature have benefits of regeneration potential, biodegradability, biocompatibility, high mechanical strength and elastic modulus, high surface area, easy chemical modification ability, etc. and become a core technology of nanotechnology (NT), which is one of three core technologies.

SUMMARY

A task for solving in the present disclosure is to provide a semiconductor material including a cellulose nanocrystal.

Another task for solving in the present disclosure is to provide a method of manufacturing a semiconductor material including a cellulose nanocrystal.

The tasks for solving in the inventive disclosure are not limited to the aforementioned tasks, and unreferred other tasks will be clearly understood by a person skilled in the art from the description below.

An embodiment of the inventive concept provides a semiconductor material, including: a cellulose nanocrystal; and a dopant at the surface of the cellulose nanocrystal, wherein the dopant includes an electron withdrawing group or an electron donating group, and the cellulose nanocrystal has conductivity.

In an embodiment, the electron withdrawing group may include $CF_3SO_2^-$.

In an embodiment, the dopant may include trifluoromethanesulfonylimide (TFSI) anions or trifluoromethanesulfonylamine (TFSA) anions.

In an embodiment, the dopant may include Ag-trifluoromethanesulfonylimide (Ag-TFSI) or Ag-trifluoromethanesulfonylamine (Ag-TFSA).

In an embodiment, the cellulose nanocrystal may have conductivity through being doped with the dopant including an electron withdrawing group and increasing holes in the cellulose nanocrystal.

In an embodiment, the cellulose nanocrystal may have conductivity through being doped with the dopant including an electron donating group and increasing free electrons in the cellulose nanocrystal.

In an embodiment of the inventive concept, a method of manufacturing a semiconductor material includes: preparing a cellulose nanocrystal aqueous solution and a dopant solution; stirring the cellulose nanocrystal aqueous solution and the dopant solution; and doping the cellulose nanocrystal. with a dopant.

In an embodiment, the dopant solution may include an electron withdrawing group or an electron donating group.

In an embodiment, the electron withdrawing group may include $CF_3SO_2^-$.

In an embodiment, the dopant solution may include TFSI anions or
TFSA anions.

In an embodiment, the dopant solution may include an organic solvent.

In an embodiment, a concentration of the dopant in the dopant solution may be about 0.1 mM to about 1 mM.

In an embodiment, the doping the cellulose nanocrystal. with the dopant may be performed in a temperature range of about 15° C. to about 100° C.

In an embodiment, through the doping the cellulose nanocrystal. with the dopant, the dopant including the electron withdrawing group may be joined to the surface of the cellulose nanocrystal to increase holes in the cellulose nanocrystal.

In an embodiment, through the doping the cellulose nanocrystal. with the dopant, the dopant including the electron donating group may be joined to the surface of the cellulose nanocrystal to increase free electrons in the cellulose nanocrystal.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
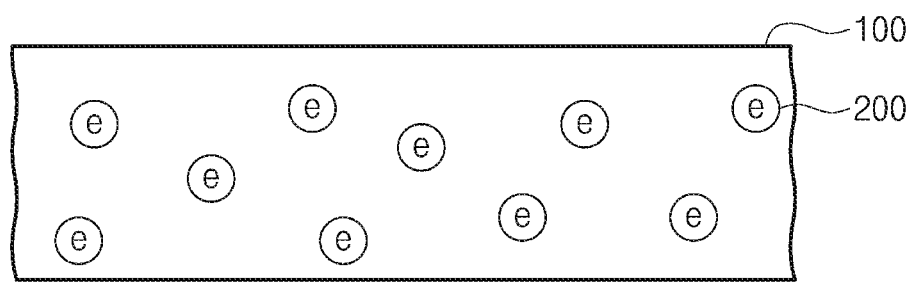
FIG. 1 shows a structure in which free electrons are present at the surface of a layer structure of cellulose nanocrystals.

The advantages and the features of the inventive concept, and methods for attaining them will be described in example embodiments below with reference to the accompanying drawings. The inventive concept may, however, be embodied in different forms and should not be construed as limited to the embodiments set forth herein. Rather, these embodiments are provided so that this description will be thorough and complete, and will fully convey the scope of the present inventive concept to those skilled in the art. The inventive concept is defined by the scope of the claims attached herein only. Like reference numerals refer to like elements throughout.

The terminology used herein is for the purpose of describing particular example embodiments only and is not intended to limit the present inventive concept. As used herein, the singular forms are intended to include the plural forms as well, unless the context clearly indicates otherwise. It will be further understood that the terms "comprises" and/or "comprising," when used in this specification, specify the presence of stated features, steps, operations, and/or devices, but do not preclude the presence or addition of one or more other features, steps, operations, and/or devices thereof.

In addition, example embodiments are described herein with reference to cross-sectional views and/or plan views that are schematic illustrations of idealized example embodiments. In the drawings, the thicknesses of layers and regions may be exaggerated for effective explanation of technical contents. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present inventive concept.

Unless otherwise defined, all terms used herein have the same meaning as commonly understood by one of ordinary skill in the art to which this inventive concept belongs.

The cellulose nanomaterial according to an embodiment of the present disclosure may be classified according to the shape into cellulose nanofiber with a long fiber shape in which cellulose nanocrystals are connected into non-crystals and cellulose nanocrystal of a minimum unit which may be physically or chemically isolated.

In the present disclosure, the width of the cellulose nanocrystal may be generally about 30 nm or less and may form a helically arranged structure with respect to an axis direction. Particularly, the cellulose nanocrystals in the present disclosure may have a layer structure including a plurality of single layers, and in the single layer, carbon may be connected into a hexagonal ring shape.

Due to such crystal structure, the cellulose nanocrystal has a band gap, but the band gap is very large and about 4 eV or more, and the cellulose nanocrystal shows electrically nonconductive properties in nature. In addition, the cellulose nanocrystal has no defects and may have an elasticity coefficient of about 150 GPa, and excellent acid resistance, and thus may be utilized as a composite material, a composite raw material for medical and engineering purposes.

Generally, if cellulose nanofiber is hydrolyzed by an acid, a non-crystalline region is hydrolyzed faster than a crystalline region, and if cellulose is hydrolyzed in suitable conditions by using this characteristic, cellulose nanocrystals may be obtained.

FIG. 1 schematically shows a structure in which free electrons are present at the surface of a layer structure of cellulose nanocrystals. At the surface of the cellulose nanocrystals having a layer structure, hydrogen atoms (H) are present in high concentration, and the movement of free electrons is possible due to such high concentration of hydrogen atoms. FIG. 1 schematically shows free electrons which may move by hydrogen atoms concentrated at the surface of cellulose nanocrystals having a layer structure. The free electrons may freely move, and accordingly, the cellulose nanocrystals may have conductivity by the present disclosure. However, the density of free electrons is very low and a cellulose nanocrystal is nonconductive in nature.

By introducing dopants 400 and 450, which will be explained later, into a cellulose nanocrystal 100 having electrically nonconductive properties, a cellulose nanocrystal having conductivity may be manufactured according to the present disclosure.

Figure 2:
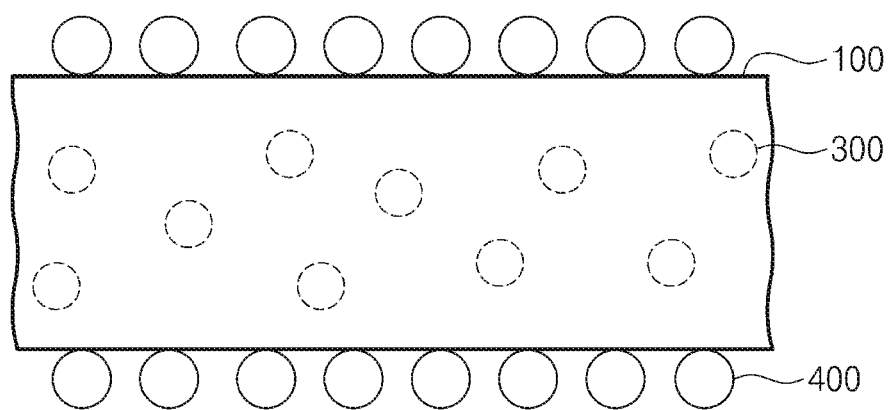
FIG. 2 shows a structure in which cellulose nanocrystals are doped with a dopant including an electron withdrawing group and a structure in which holes are formed in the cellulose nanocrystals.

FIG. 2 shows a structure in which cellulose nanocrystals are doped with a dopant including an electron withdrawing group and shows a structure in which holes are formed in the cellulose nanocrystals surfaces.

Referring to FIG. 2, by introducing a dopant 400 including an electron withdrawing group into the surface of the cellulose nanocrystal 100, the concentration of holes 300 in the cellulose nanocrystal 100 may increase. Accordingly, the cellulose nanocrystal 100 may have conductivity.

Particularly, if the dopant 400 including an electron withdrawing group is introduced into the surface of the cellulose nanocrystal 100, the dopant 400 may withdraw the electrons of the cellulose nanocrystal 100, and holes 300 may increase in the cellulose nanocrystal 100. Accordingly, the cellulose nanocrystal 100 may have electrical conductivity and show the properties of a p-type semiconductor material.

The dopant 400 may include an organic acid or inorganic acid including an electron withdrawing group. The electron withdrawing group may be, for example, $CF_3SO_2^-$.

For example, the inorganic acid may include a triflate-based ($CF_3SO_3^-$) inorganic acid, a sulfoneimide-based inorganic acid, a sulfoneamide-based inorganic acid, a tetrafluoroborate-based inorganic acid, a perchlorate-based inorganic acid, a hexafluorophosphate-based inorganic acid, a fluoroantimonic acid-based inorganic acid, a silver-based inorganic acid, or a tellurium-based inorganic acid.

The organic acid or inorganic acid may include metal ions. The metal ions may be included in the organic acid or inorganic acid through substitution with hydrogen ions or as a complex type. The metal ion may use a metal ion not generating transition between d-orbitals, which induces light absorption in a visible light region, for example, a metal ion in which all d-orbitals are filled with electrons. Particularly, the metal ion may include $Ag^+$, $Zn^{2+}$, $Ce^{3+}$, $K^+$, metal ions in lanthanides, or metal ions in actinoids.

The triflate-based inorganic acid may include silver trifluoromethanesulfonate, scandium(III) triflate, or trifluoromethanesulfonic anhydride, the sulfoneimide-based inorganic acid may include bis(trifluoromethane)sulfoneimide ($(CF_3SO_2)_2NH$), a bis(trifluoromethane)sulfoneimide lithium salt, silver bis(trifluoromethanesulfoneimide), bis(pentafluoroethylsulfonyl)imide, or nitrosyl bis(trifluoromethane)sulfomeimide, and the sulfoneamide-based inorganic acid may include trifluoromethanesulfoneamide, or 2,2,2-trichloroethoxysulfoneamide.

For example, the dopant 400 including the electron withdrawing group in the present disclosure may include trifluoromethanesulfonylimide (TFSI) anions, or a trifluoromethanesulfonylamine (TFSA) anions.

For example, the dopant 400 including the electron withdrawing group in the present disclosure may include silver-trifluoromethanesulfonylimide (Ag-TFSI) or silver-trifluoromethanesulfonylamine (Ag-TFSA).

Due to the hydrophobicity and chemical stability of the trifluoromethanesulfonylimide (TFSI) including trifluoromethane having strong electron withdrawing properties, a semiconductor material including the cellulose nanocrystal 100 doped with TFSI may maintain a stable state.

Figure 3:
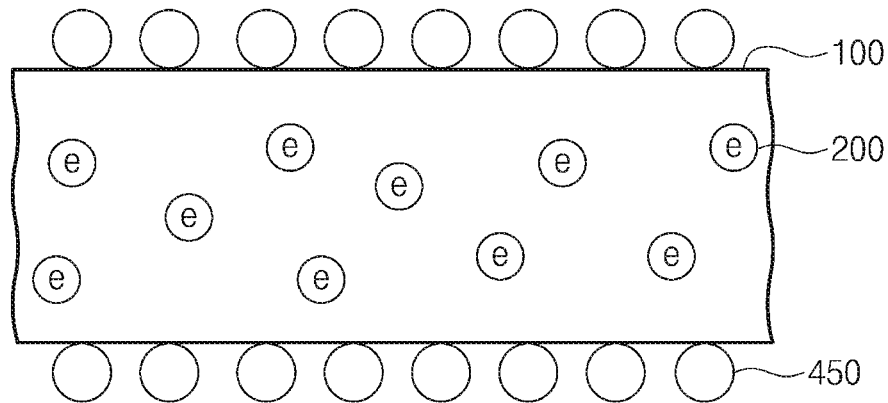
FIG. 3 shows a structure in which cellulose nanocrystals are doped with a dopant including an electron donating group and a structure in which free electrons are formed in the cellulose nanocrystals.

FIG. 3 shows a structure in which cellulose nanocrystals are doped with a dopant including an electron donating group and a structure in which free electrons are formed in the cellulose nanocrystals.

Referring to FIG. 3, by introducing the dopant 450 including the electron donating group into the surface of the cellulose nanocrystal 100, the concentration of free electrons 200 in the cellulose nanocrystal 100 may increase. Accordingly, the cellulose nanocrystal 100 may have conductivity.

Particularly, if the surface of the cellulose nanocrystal 100 is doped with the dopant 450 including the electron donating group, the cellulose nanocrystal 100 donates the electrons of the dopant 450, and the free electrons 200 in the cellulose nanocrystal 100 may increase. Accordingly, the cellulose nanocrystal 100 may show electrical conductivity and may have the properties of an n-type semiconductor material.

Figure 4:
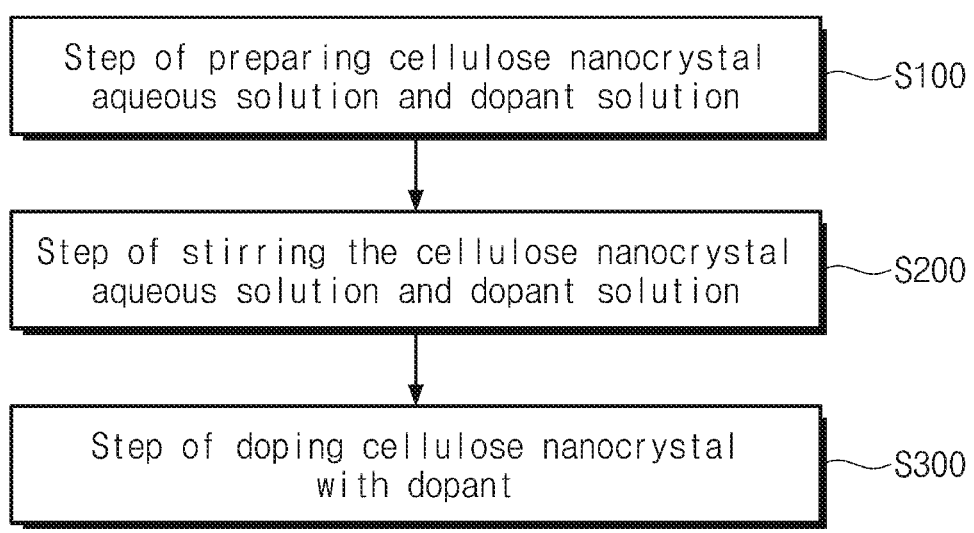
FIG. 4 is a flowchart of a method of manufacturing a semiconductor material including a cellulose nanocrystal according to an embodiment of the present disclosure.

FIG. 4 is a flowchart of a method of manufacturing a semiconductor material including a cellulose nanocrystal according to an embodiment of the inventive concept.

Referring to FIG. 4 together with FIG. 2 and FIG. 3, the method of manufacturing a semiconductor material including the cellulose nanocrystal according to an embodiment of the present disclosure may include a step of preparing a cellulose nanocrystal aqueous solution and a dopant solution (S100), a step of stirring the cellulose nanocrystal aqueous solution and the dopant solution (S200), and a step of doping the cellulose nanocrystal 100 with dopants 400 and 450 (S300).

The step of doping the cellulose nanocrystal 100 with the dopants 400 and 450 (S300) may be performed by a dipping process or a spray process.

Particularly, the dipping process may include a step of dipping the cellulose nanocrystal 100 in the doping solution and then, drying in the air or nitrogen conditions so as to introduce the dopants 400 and 450 into the surface of the cellulose nanocrystal 100.

The spray process may include a step of spraying the doping solution on the surface layer of the cellulose nanocrystal 100 using a spray and then, drying in the air or nitrogen conditions so as to introduce the dopants 400 and 450 into the surface of the cellulose nanocrystal 100.

The step of doping the cellulose nanocrystal 100 with the dopants 400 and 450 (S300) may be performed in a temperature range of about 15° C. to about 100° C.

After performing the step of doping the cellulose nanocrystal 100 with the dopants 400 and 450, a drying process may be performed to evaporate an organic solvent. The drying process may be performed by natural drying in the air, or may be performed by mechanical drying using heat-drying at about 30° C. or more.

The dopant solution may include an electron withdrawing group or an electron donating group.

The dopant solution including the electron withdrawing group may include $CF_3SO_2^-$.

The dopant solution may include TFSI anions or TFSA anions.

The dopant solution may include an organic solvent. The organic solvent may include an organic solvent in which a dopant is dissolved or dispersed, and may particularly include nitromethane, nitrobenzene, dimethylformamide, N-methyl-2-pyrrolidinone, tetrahydrofuran, acetonitrile, dimethyl sulfoxide, ethanol, or water.

In the dopant solution, the concentration of the dopant may be from about 0.1 mM to about 1 mM.

Due to the hydrophobicity and chemical stability of the trifluoromethanesulfonylimide (TFSI) including trifluoromethane having strong electron withdrawing properties, a semiconductor material including the cellulose nanocrystal 100 doped with TFSI may maintain a stable state.

The explanation on the dopant 400 including the electron withdrawing group is substantially the same as that referring to FIG. 3.

The explanation on the dopant 450 including the electron donating group is substantially the same as that referring to FIG. 4.

If the surface of the cellulose nanocrystal 100 is doped with the dopant 400 including the electron withdrawing group according to the manufacturing method of an embodiment of the present disclosure, the dopant 400 withdraws the electrons of the cellulose nanocrystal 100, and holes 300 may increase in the cellulose nanocrystal 100. Accordingly, the cellulose nanocrystal 100 manufactured by the aforementioned manufacturing method may have electrical conductivity and the properties of a p-type semiconductor material.

If the surface of the cellulose nanocrystal 100 is doped with the dopant 450 including the electron donating group according to the manufacturing method of an embodiment of the present disclosure, the dopant 450 donates the electrons to the cellulose nanocrystal 100, and free electrons 200 may increase in the cellulose nanocrystal 100. Accordingly, the cellulose nanocrystal 100 manufactured by the aforementioned manufacturing method may have electrical conductivity and the properties of an n-type semiconductor material.

Example 1

Silver-trifluoromethanesulfonylimide (Ag-TFSI) was dissolved in nitromethane to obtain a concentration of about 2 mM, and the solution thus obtained was put in 0.1 wt % of cellulose nanocrystal CNC aqueous solution, followed by stirring at room temperature. In this case, Ag was precipitated, and the surface of the cellulose nanocrystals was doped with a dopant including TFSI anions.

Example 2

The surface of cellulose nanocrystals was doped with a dopant including TFSA anions by doping the cellulose nanocrystals by the aforementioned method except for using silver-trifluoromethanesulfonylamine (Ag-TFSA) as a dopant.

Figure 5:
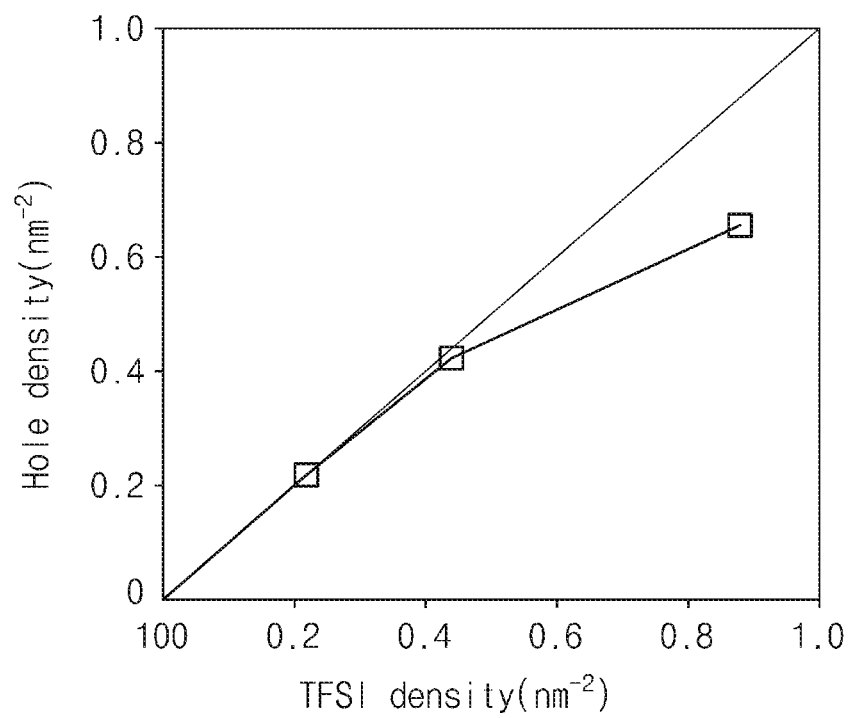
FIG. 5 shows hole density in cellulose nanocrystals in accordance with the concentration of trifluoromethanesulfonylimide (TFSI).

FIG. 5 shows hole density in cellulose nanocrystals in accordance with the concentration of trifluoromethanesulfonylimide (TFSI) prepared in Example 1.

Referring to FIG. 5, it could be confirmed that the density of the holes 300 of the cellulose nanocrystals increased linearly in proportion until a TFSI concentration was about 0.3 $nm^{-2}$. Particularly, it could be confirmed that with the increase of the concentration of the fluoromethanesulfonylimide (TFSI), the density increasing ratio of the holes 300 decreased.

The present disclosure relates to a semiconductor material including a cellulose nanocrystal and a manufacturing method thereof, and particularly, according to the present disclosure, by attaching an electron withdrawing group or an electron donating group to the surface of the cellulose nanocrystal which is a nonconductor, holes or free electrons are formed in the cellulose nanocrystal, and the cellulose nanocrystal may be used as a semiconductor material.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of manufacturing a cellulose nanocrystal semiconductor material, the method comprising:
   preparing an aqueous solution comprising a cellulose nanocrystal and a solution comprising a dopant;
   stirring the aqueous solution comprising a cellulose nanocrystal and the solution comprising a dopant; and
   doping the cellulose nanocrystal with the dopant to provide a doped cellulose nanocrystal,
   wherein the dopant comprises an electron withdrawing group, and the electron withdrawing group comprises $CF_3SO_2^-$.

2. The method of manufacturing a cellulose nanocrystal semiconductor material of claim 1, wherein the doped cellulose nanocrystal has conductivity.

3. The method of manufacturing a cellulose nanocrystal semiconductor material of claim 1, wherein the solution further comprises $Ag^+$.

4. The method of manufacturing a cellulose nanocrystal semiconductor material of claim 1, wherein the solution further comprises an organic solvent.

5. The method of manufacturing a cellulose nanocrystal semiconductor material of claim 1, wherein the dopant in the solution comprising a dopant has a concentration that ranges from about 0.1 mM to about 1 mM.

6. The method of manufacturing a cellulose nanocrystal semiconductor material of claim 1, wherein doping the cellulose nanocrystal with the dopant is performed at a temperature ranging from about 15° C. to about 100° C.

7. The method of manufacturing a cellulose nanocrystal semiconductor material of claim 1, wherein the cellulose nanocrystal comprises electrons, and doping the cellulose nanocrystal with the dopant comprises:
   joining the dopant to the surface of the cellulose;
   withdrawing electrons from the cellulose nanocrystal by the dopant; and
   forming holes in the cellulose nanocrystal.

8. The method of manufacturing a cellulose nanocrystal semiconductor material of claim 1, wherein the doped cellulose nanocrystal has p-type conductivity.

* * * * *